United States Patent
Esbensen (10) Patent No.: US 7,149,765 B2
(45) Date of Patent: Dec. 12, 2006

(54) APPARATUS AND METHOD FOR PRECISION BINARY NUMBERS AND NUMERICAL OPERATIONS

(75) Inventor: Daniel Esbensen, Blue Diamond, NV (US)

(73) Assignee: Touch Technologies, Inc., San Diego, CA (US)

( * ) Notice: Subject to any disclaimer, the term of this patent is extended or adjusted under 35 U.S.C. 154(b) by 699 days.

(21) Appl. No.: 10/099,905

(22) Filed: Mar. 12, 2002

(65) Prior Publication Data

US 2003/0069912 A1 Apr. 10, 2003

Related U.S. Application Data

(60) Provisional application No. 60/275,323, filed on Mar. 12, 2001, provisional application No. 60/275,324, filed on Mar. 12, 2001.

(51) Int. Cl.
*G06F 7/38* (2006.01)

(52) U.S. Cl. ...................................... 708/490
(58) Field of Classification Search ................. 708/490
See application file for complete search history.

(56) References Cited

U.S. PATENT DOCUMENTS

| | | | |
|---|---|---|---|
| 5,050,121 A | | 9/1991 | Vaughan |
| 2002/0184282 A1* | | 12/2002 | Yuval et al. ................. 708/495 |
| 2002/0184285 A1* | | 12/2002 | Pangal et al. ............... 708/505 |

OTHER PUBLICATIONS

"What Every Computer Scientist Should Know About Floating-Point Arithmetic", Sun Microsystems, Jun. 1992, pp. 1-74. (http://docs-pdf.sun.com/800-7895/800-7895.pdf).
"Computer Numbering Formats", v1.2, Greg Goebel, Dec. 4, 1998, pp. 1-20. (http://vectorsite.tripod.com/tsfloat.htm).
"Data Representation Notes", Evan Weaver, ed. David Ward, Jun. 6, 2000, pp. 1-16. (http://cs.senecac.on.ca/~ics124_datarep_new.html).
"Numeric and Data Conversions" Chapter 9, pp. 1-18. (http://www.ugf.edu/compsci/lmarshall/chptrnin.htm).

* cited by examiner

*Primary Examiner*—Tan V. Mai
(74) *Attorney, Agent, or Firm*—Stephen J. LeBlanc; Quine Intellectual Property Law Group, P.C.

(57) ABSTRACT

An method and/or apparatus for representing and/or operating on numerical values in binary systems whereby numerical values having integer and fractional portions are stored in non-contiguous memory locations.

21 Claims, 2 Drawing Sheets

A1
receive a numerical value N

A2
determine integer portion of N and store as in a computer storage area as $N_{IP}$ A3
determine fractional portion of N and store as in a computer storage area as $N_{IF}$ A4
return a pointer to $N_{IP,FP}$ to allow other operations to be performed

APPARATUS AND METHOD FOR PRECISION BINARY NUMBERS AND NUMERICAL OPERATIONS

CROSS REFERENCE TO RELATED APPLICATIONS

This application claims benefit of priority from provisional application 60/275,324 filed Mar. 12, 2001.

This application claims benefit of priority from provisional application 60/275,323 filed Mar. 12, 2001.

The above referenced applications and all documents or publications or publicly available information referenced herein is incorporated in its entirety by reference for all purposes.

COPYRIGHT NOTICE

Pursuant to 37 C.F.R. 1.71(e), Applicants note that a portion of this disclosure contains material that is subject to and for which is claimed copyright protection (such as, but not limited to, source code listings, screen shots, user interfaces, or user instructions, or any other aspects of this submission for which copyright protection is or may be available in any jurisdiction.). The copyright owner has no objection to the facsimile reproduction by anyone of the patent document or patent disclosure, as it appears in the Patent and Trademark Office patent file or records. All other rights are reserved, and all other reproduction, distribution, creation of derivative works based on the contents, public display, and public performance of the application or any part thereof are prohibited by applicable copyright law.

APPENDIX

This application is being filed with paper appendices totaling 43 pages. These appendices and all other papers filed herewith, including papers filed in any attached Information Disclosure Statement (IDS), are incorporated herein by reference. The appendix contains further examples of source code listings and information related to various embodiments of the invention at various stages of development.

FIELD OF THE INVENTION

The present invention relates to representation of numerical values in binary systems. More particularly, the present invention is directed to a method and/or associated apparatus for storing numerical data in binary systems and performing operations thereon. In specific embodiments, the invention involves a computer implemented method and/or an information processing system and components thereof.

BACKGROUND OF THE INVENTION

The discussion of any work, publications, sales, or activity anywhere in this submission, including in any documents submitted with this application, shall not be taken as an admission by the inventors that any such work constitutes prior art. The discussion of any activity, work, or publication herein is not an admission that such activity, work, or publication existed or was known in any particular jurisdiction.

In order for numbers to be manipulated in binary information processing systems, they must be converted to a form that can be handled within the inherent base-2 representation of binary systems. For example, the two-byte integer 63119d (hereinafter d indicates decimal notation, h indicates hexadecimal, b indicates binary notation) may be represented in a computer's binary memory as the binary number 1100000110001011b. This is usually stored as two eight-bit bytes, 11000001b-10001011b (or C1h-8Bh or 193d-139d).

Many variations are known for representing numerical values in binary systems. One important scheme is known as "2's complement notation." In this scheme, all numbers have a sign bit associated with them. Positive numbers are represented as a sign bit (e.g., usually 0) and the binary value of the number. Negative numbers are represented as follows: (1) take the absolute value of the number, (2) perform a bit-wise inverse of the absolute value, (3) add "1", (4) include the sign bit. Thus, in an 8-bit 2's complement notation, with the leftmost bit the sign bit, 8d is represented as 00001000b and -8d is represented as 11111000b.

Representing floating point numbers in binary systems presents additional issues. A variety of binary floating-point formats have been defined for computers; one of the most popular is that defined by IEEE (Institute of Electrical & Electronic Engineers) known as IEEE 754.

The IEEE 754 specification defines 64 bit floating-point format with three parts:

(1) An 11-bit binary exponent, using "excess-1023" format. In this format, the exponent is represented as an unsigned binary integer from 0 to 2047, and one subtracts 1023 to get the signed value of the exponent.

(2) A 52-bit mantissa, also an unsigned binary number, defining a fractional value with a leading implied "1".

(3) A sign bit, giving the sign of the mantissa.

The following illustrates how such a number might be stored in 8 bytes of memory where "S" denotes the sign bit, "x" denotes an exponent bit, and "m" denotes a mantissa bit:

| byte 0: | S   | x10 | x9  | x8  | x7  | x6  | x5  | x4  |
|---------|-----|-----|-----|-----|-----|-----|-----|-----|
| byte 1: | x3  | x2  | x1  | x0  | m51 | m50 | m49 | m48 |
| byte 2: | m47 | m46 | m45 | m44 | m43 | m42 | m41 | m40 |
| byte 3: | m39 | m38 | m37 | m36 | m35 | m34 | m33 | m32 |
| byte 4: | m31 | m30 | m29 | m28 | m27 | m26 | m25 | m24 |
| byte 5: | m23 | m22 | m21 | m20 | m19 | m18 | m17 | m16 |
| byte 6: | m15 | m14 | m13 | m12 | m11 | m10 | m9  | m8  |
| byte 7: | m7  | m6  | m5  | m4  | m3  | m2  | m1  | m0  |

Once the bits are extracted from such a stored number, they are converted with the computation:

$$<\text{sign}>*(1+<\text{fractional\_mantissa}>)*2^{(<\text{exponent}>-1023)}$$

This particular scheme provides numbers valid out to 15 decimal digits, with the following range of numbers:

|          | maximum                | minimum                |
|----------|------------------------|------------------------|
| positive | 1.797693134862231E+308 | 4.940656458412465E−324 |
| negative | −4.940656458412465E−324| −1.797693134862231E+308|

The 754 specification also defines several special values that are not defined numbers, and are known as "NANs", for "Not A Number". These are used by programs to designate overflow errors and the like.

A variation of this scheme uses 32-bits, such as a 23-bit mantissa with a sign bit and an 8-bit exponent (in excess-127 format), giving 7 valid decimal digits. The bits are converted to a numeric value with the computation:

<sign>*(1+<fractional_mantissa>)* 2^(<exponent>−127), leading to the following range of numbers:

|  | maximum | minimum |
|---|---|---|
| positive | 3.402823E+38 | 2.802597E−45 |
| negative | −2.802597E−45 | −3.402823E+38 |

Such floating-point numbers are sometimes referred to as "reals" or "floats": a 32-bit float value is sometimes called a "real32" or a "single" (indicating "single-precision floating-point value") while a 64-bit float is sometimes called a "real64" or a "double" (indicating "double-precision floating-point value").

Even with these floating-point numbers, precision problems can be encountered. As with integers, there is only a finite range of values, though it is a larger range. Therefore, some calculations can cause "numeric overflow" or "numeric underflow." The maximum real value allowed in a particular system is sometimes referred to as "machine infinity," because it is the largest value the computer can handle.

A further problem is that there is limited precision to computer-encoded real numbers: for example, one can only represent 15 decimal digits with a 64-bit real. If the result of a multiply or a divide has more digits than that, these digits are generally dropped and some computer systems may not provide information indicating the drop. In such systems, if one adds a small number to a large one, the result is just the large number if the small number is too small to appear in 15 or 16 digits of precision. As a result, in many floating-point computations, there can be a small error in the result because some lower digits have been dropped. This may be unnoticeable in most cases, but in math analysis that requires a lot of computations, the errors tend to build up and can affect the results.

Another error that can arise in floating-point numbers is due to the fact that the mantissa is expressed as a binary fraction that may not perfectly match a desired decimal fraction. Consider the following. The number 123 can be represented precisely as a binary value (such as 1111011) with an exponent of zero, e.g., $2^0$. The number 123.5 can also be represented precisely as a binary value of 247d (11110111) with an exponent −1, e.g. $2^{-1}$. There is no loss of precision because the decimal fraction can be precisely represented in the binary system. However, a number such as 123.10 (particularly important in currency calculations) there is no finite series of 1's and 0's to any power of 2 that will exactly express 123.1. The 0.1 portion in binary is a repeating fraction and in standard binary can only be expressed as an infinite series that will not converge. Because of this, typically in commercial applications with dollars and cents where it is not unusual to be adding 100,000's of currency (dollars and cents) numbers, the summation at the end is always inaccurate. This can be a major programming problem when performing a summation then subtracting an expected value and comparing the result to zero to determine accuracy. Programs typically have to perform tedious tasks to get around this problem, such as examining tolerance levels (epsilon) to determine if a difference from zero is within the tolerance level in order to know if it is the right value.

An alternative format used in some systems is to create fixed decimal point representations for real values (sometimes referred to as scaled values). As an example, the encoding scheme FOUR assumes for all encoded numbers that four decimal digits are present after the decimal. Decimal values (such as 1222.01) are multiplied by $10^{scale\_factor}$ for storage in such a system. Thus, 123.1 would be stored in a binary integer storage area, and it is stored as $N*10^{scale\_factor}$ (e.g. 1231000). All computations are then done on binary whole numbers, without a loss of significance. However, this means that on a system with 64-bit integers (19 decimal digits of data), in the given example, this would allow only the representation of 15 digits left of the decimal point and four to the right of the decimal point. In the case where there is needed more significance than 19 digits, typically two contiguous storage areas are used, for example 96 bits, and the additional storage area represents the high order digits of the number.

In this representation, generally a CPU's built-in math functions cannot be used directly. Instead, all math functions have to be software emulated (SWE), which generally is very slow. Especially slow are operations such as rounding the fraction part to a given significance (such as to the nearest penny). Rounding is especially slow because the rounding operation has to apply to all 96 bits through SWE. For example, typically having to use SWE and applying 96 bits can be between 100 and 1000 times slower than using a computer processor's built in math unit.

Another format used to handle decimal numbers and address some of these issues is Binary Coded Decimal (BCD). In this notation groups of 4 bits are used to represent each decimal digit from 0 to 9. This method can represent two digits per byte of information. Nevertheless, it is used in some business applications. However, in BCD, everything is treated as a large integer, and there is a scaling factor. For example, all numbers may be treated as scaled by $10^9$. One advantage of this technique is that rounding and carry across the implied decimal location in either direction is automatic. A further advantage is that all numerical operations can be handled using integer math. However, in certain situations, BCD provides various complications in arithmetic operations and is far less efficient for number storage that other binary encoding schemes.

In prior art systems, floating point processing of floating point numbers that are defined by a known standard is often handled by a Floating Point Unit (FPU), typically an integrated circuit module or area designed to handle floating-point numbers. In systems without a "hardware" FPU, floating point operations are generally handled by software.

SUMMARY

The present invention, in various embodiments, entails a method and/or apparatus and/or digital logic circuit for more effectively handling numerical values in a binary information handling system.

In specific embodiments, the present invention involves using two non-contiguous (or "separated") bit areas to store real numbers. These areas are referred to as non-contiguous because there is no automatic binary carry in either direction with regard to the bit areas. Furthermore, these areas are referred to as non-contiguous because unlike other encoding schemes, in a given number there is no dependency on either part of the number to determine the value of the other part. In other words, the integer portion of a decimal is dependent only on the integer portion of the stored binary value. Likewise, the fractional portion of a decimal is dependent only on the fractional portion of the stored binary value. In terms of their actual storage in a computer's memory, however, the different portions of the numbers may be stored in memory locations next to each other. Thus, according to specific embodiments of the invention, a real number as discussed herein is stored as an integer part (IP) and a fractional part (FP).

According to further specific embodiments of the invention, the "independence" of the IP and FP of a number extend into the sign bits and both the IP and the FP carry a sign bit. In specific embodiments, the sign bits on the IP and the FP are always identical for both portions. As used herein, such a number may be designated as N.IP.FP.

The IP according to specific embodiments of the invention is represented as a conventional binary integer. In specific embodiments, a sign bit is included as the first bit, with 2's complement or other notation used to represent negative numbers.

The FP according to specific embodiments of the invention is also represented as a conventional binary integer. In specific embodiments, a sign is also included as the first bit, with 2's complement or other notation used to represent negative numbers. However the fractional portion of the decimal number is multiplied by $10^{scale\_factor}$ to insure all bits of precision of interest are within the integer. For example, in a scale_factor=9 system, the fractional part of a decimal number is multiplied by $10^9$ before it is stored in the FP, as indicated in the following table:

| Decimal Part | FP |
|---|---|
| .4 | 400 000 000 |
| .03456 | 034 560 000 |
| .1415926 | 141 592 600 |

According to specific embodiments of the invention, the scale_factor is a selected power of 10 and indicates the number of fractional decimal digits supported by the system. Scale is sometimes used to herein to indicate $10^{scale\_factor}$.

According to specific example embodiments of the invention used herein for discussion purposes, 64-bits are used for the integer portion and 32 bits for the decimal portion, thus a single FP requires 96-bits of storage. As used herein, such a number may be designated as an r96 (for real-96 bit).

In specific embodiments, a numbering representation according to the present invention uses 18 decimal digits in the whole part of the number and 9 digits (though a reduction to such as 8 digits may be used in order to speed some processing, such as an associated binary→ascii conversion) in the decimal portion, which allows some implementations to use CPU built-in math functions in various CPUs.

Carries

One issue that arises using this method is that carries between the IP and FP portions of a number are not handled automatically. As discussed below, different numerical operators handle carries between the IP and FP explicitly and with appropriate variations for each operation.

Note that generally, the binary space for an FP will be able to hold a number that is larger that the maximum FP allowed. In a system with 8 decimal digits in the FP portion, for example, the largest FP that can be represented is 0.99999999d. To store this number requires 27 bits for the binary value (101111101011110000011111111), plus a sign bit, for a total of 28 bits. However, the largest decimal number using this representation that can be stored in 27 bits is 2.18103807, higher than 0.99999999d. Thus, for many mathematical operations, the resultant FP portion (S.FP) will be compared to the MAX.FP (e.g. 0.99999999d) and if over the MAX.FP, will cause a carry bit to be active and will be decremented by the MAX.FP.

The invention and various specific aspects and embodiments will be better understood with reference to the following drawings and detailed descriptions. For purposes of clarity, this discussion refers to devices, methods, and concepts in terms of specific examples. However, the invention and aspects thereof may have applications to a variety of types of devices and systems. It is therefore intended that the invention not be limited except as provided in the attached claims.

Furthermore, it is well known in the art that logic systems and methods such as described herein can include a variety of different components and different functions in a modular fashion. Different embodiments of the invention can include different mixtures of elements and functions and may group various functions as parts of various elements. For purposes of clarity, the invention is described in terms of systems that include many different innovative components and innovative combinations of innovative components and known components. No inference should be taken to limit the invention to combinations containing all of the innovative components listed in any illustrative embodiment in this specification.

The functional aspects of the invention that are implemented on a computer, as will be understood from the teachings herein, may be implemented or accomplished using any appropriate implementation environment or programming language, such as C, C++, Cobol, Pascal, Java, Javascript, assembly or machine code programming, custom logic circuits, etc. All references, publications, patents, and patent applications cited herein are hereby incorporated by reference in their entirety for all purposes.

DESCRIPTION OF SPECIFIC EMBODIMENTS

In one embodiment, the invention can be understood as a computer-implemented method for storing and performing operations on numerical values.

Flowchart of a Method of Storing Numerical Data

Figure 1:
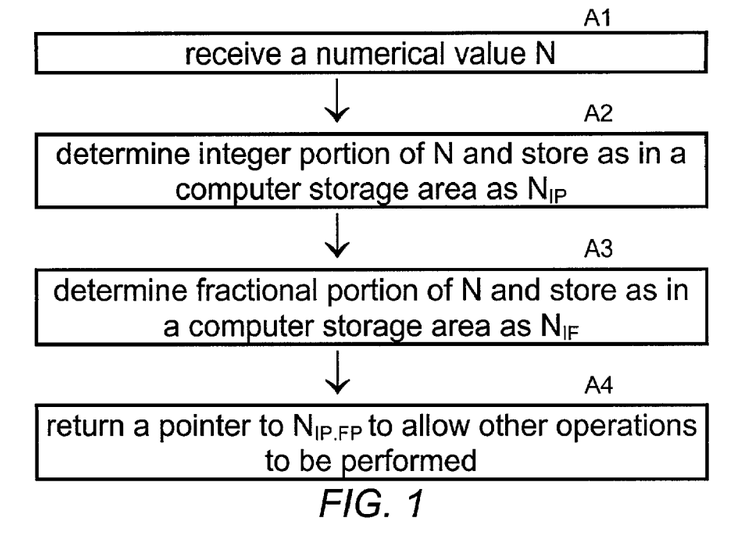
FIG. 1 illustrates an example method according to specific embodiments of the invention.

FIG. 1 illustrates an example method according to specific embodiments of the invention. The invention can be embodiment in one or more logical methods suitable for implementation by any appropriately configured information handling system, including general purpose computing systems and information handling displays and subsystems. As illustrated, a method according to specific embodiments of the present invention can be understood as initiated by receiving a numerical value N. As described elsewhere herein, this value may be initially input as a binary value, a floating-point value, or as a decimal value. (Step A1) The integer portion of the value is determined and it is stored in a computer storage area IP. (Step A2) The fractional portion of the value is determined, scaled, and stored in a computer storage area FP. (Step A3) A pointer to $N_{IP.FP}$ is returned for the number to allow other operations to be performed thereon. (Step A4)

The present invention has thus far been described in terms of general embodiments. The previous description is believed to be a full and complete description sufficient to allow a practitioner in the art of content acceleration and caching to make and use the invention. It will be understood to those of skill in the art from the teachings provided herein that the described invention or components thereof can be implemented in a wide variety of specific programming environments and logical systems (such as UNIX, Windows, Solaris, Oracle, etc.) using a wide variety of programming languages (such as SQL, Visual Basic, Pascal, C++, Basic, Java, JavaScript, etc.) and wide variety of file formats.

What follows are descriptions of example systems and methods that are involved with or may embody various aspects of the present invention. This following discussion is included, in part, in order to disclose particularly preferred modes presently contemplated for practicing the invention. The following discussion may also include independent innovative embodiments of the invention. It is intended, however, that the previous discussion and the claims not be limited by examples provided herein. It is further intended that the attached claims be read broadly in light of the teachings provided herein. Where specific examples are described in detail, no inference should be drawn to exclude other examples or to exclude examples described or mentioned briefly from the broad descriptions of the invention provided herein. It is therefore intended that the invention not be limited except as provided in the attached claims and equivalents thereof.

Mathematical and Logical Operations

According to specific embodiments, the present invention provides specific routines for various math operators, including optional shortcuts according to specific embodiments. As used herein, a notation for the portions of a real number A is A.IP and A.FP. The results of a function F(A,B) is noted as S.IP and S.FP or S.IP.FP Addition Operations Addition of two numbers, for example A and B, proceeds generally as follows. First, if one number is negative, but not another, then jump to a subtraction operation, as described below. Then, if both of the numbers are negative, store that fact, convert the numbers to positive (i.e. use the absolute values of the numbers) and perform the addition as follows:

```
    s.fp = a.fp + b.fp;
    carry = 0
    if s.fp > max.fp then
        carry = 1
        s.fp = s.fp - max.fp - 1  ;max.fp is a scaled
    number e.g. 99999999 and "1" is unscaled
    endif
    s.ip = a.ip + b.ip + carry
    if both a and b were negative then
        s.ip = - s.ip
        s.fp = - s.fp
    return
```

Subtraction Operations

Subtraction according to specific embodiments of the invention is defined as combining two numbers having different signs. With the positive number set to A and the negative number set to B, the absolute value of B is subsequently used for all compare operations and the procedure performs as indicated below. According to further specific embodiments of the invention, a number of shortcuts can be provided as indicated.

```
    ;S=A-B
    ;shortcuts according to specific embodiments
    if a = 0.0
        s.fp = -b.fp
        s.ip = -b.ip
        return
    if b = 0.0
        s.fp = a.fp
        s.ip = a.ip
        return
    ;main procedure
    if (b.ip < a.ip) and (a.fp < b.fp) then
        a.ip = a.ip-1; reverse carry
        a.fp = a.fp + max.fp + 1;max.fp is a scaled
    number e.g. 99999999 and "1" is unscaled
    endif
    if (a.ip < b.ip) and (b.fp < a.fp) then
        b.ip = b.ip-1; reverse carry
        b.fp = b.fp + max.fp + 1;
    endif
    s.fp = a.fp - b.fp
    s.ip = a.ip - b.ip
```

Multiplication and Division Operations

Multiplication and division, according to specific embodiments of the present invention, are handled by converting the operands into scaled numbers, performing the desired function F() on the scaled numbers using scaled arithmetic, and then converting the scaled result back into the N.ip.fp format.

According to specific embodiments of the present invention, the scale factor used for the scaled number can be the same scale factor used for the FP portion of the R.ip.fp number, which simplifies a number of conversion operations. (According to alternate embodiments of the invention, a different scale factor can be used, thus requiring a scaling of both the IP and FP parts to compute an $A_{scaled}$ number.)

The procedure generally works as follows (with the scale factor of $S_{scaled}$, $A_{scaled}$, and $B_{scaled}$ is set as the same scale factor used in the FP portions r.ip.fp number.

$$A_{scaled}=A.IP*10^{scale\_factor}+A.FP$$

$$B_{scaled}=B.IP*10^{scale\_factor}+B.FP$$

$$S_{scaled}=F(A_{scaled}, B_{scaled})$$

$$S.IP=\text{integer}(S_{scaled}/10^{scale\_factor})$$

$$S.FP=S_{scaled}-S.IP*10^{scale\_factor}$$

According to specific embodiments of the present invention, a number of shortcuts can be used to improve speed. These shortcuts in fact will significantly speed up many real-world applications.

Rounding

Rounding according to specific embodiments of the invention is very easy. When performing rounding, if the value of FP is greater than ½ of $10^{scale\_factor}$, set IP=IP+1. Otherwise, do not change IP. Set FP to zero.

Displaying Separately Stored Real Numbers

According to further specific embodiments of the present invention, a numerical storage scheme according to the invention can be beneficially used with an innovative method for converting numerical data to display codes. Conversion to display codes is simplified because the IP and FP parts of the real number are stored separately. With this scheme, the integer portion and the fractional portion can separately be converted to display codes as described above. Details of such a procedure are provided in the above referenced provisional patent applications from which priority is claimed and in patent application 10/099,928 entitled APPARATUS AND METHOD FOR CONVERTING BINARY NUMBERS TO CHARACTER CODES filed by the same inventor on 12 Mar. 2002.

Other Implementation Details

It will be understood from the teachings provided herein, that a method according to the present invention can be variously implemented in computing systems. In one implementation, computer-understandable logic instructions related to the present invention can be included in an application program and/or can be invoked by an application program during initiation and/or execution.

Note that according to further specific embodiments of the present invention, a numerical encoding scheme can be implemented in an operating system (OS) of a computing device and thereby be made available to any application programs running in the operating system. Thus, according to specific implementations of the present invention, an OS can create a data template and operator routines during OS initiation.

It will further be understood from the teachings herein, that logic routines according to the present invention can be included in a logic instruction compiler or logic instruction interpreter and/or include or other files associated with such a programming environment.

Embodiments in an Information Processing Architecture

As discussed herein, according to specific embodiments, the present invention can be embodied in a method implemented on an information handling system, such as a computer or a variety of other devices that include information handling functionality. Such other devices can include, but are not limited to, personal digital assistants (PDAs), cellular telephones, television set top systems or cable systems interfaces, toys, home appliances with information handling abilities, scientific and diagnostic systems, and machinery or industrial systems with information handling abilities.

Typically, information handling in such systems is performed by binary logic circuits. According to further specific embodiments, the present invention can be embodied in either an information handling system or circuitry or components of an information handling system performing according to the description herein.

According to further specific embodiments, the invention can be embodied as one or more sets of instructions and/or data that are used to program or guide or affect the operation of an information handling system. As is known in the art, these sets of instructions and/or data can be distributed to users stored or recorded on a storage medium, such as a disk, diskette, hard-drive, CD-ROM, tape, ROM, EPROM, ASIC, PLD, etc., and according to specific embodiments, the invention can be embodied as such a medium storing data and/or instructions that when loaded into an appropriately configured information system will cause the system to performing according to the description herein.

As is further known in the art, sets of instructions and/or data can be transmitted to an information handling system over a communication medium (such as the internet, a local area network, a wireless network, a telephone line, a cable-television system, etc.) from a remote data holding location (such as a server) and thereby when loaded into an appropriately configured information system will cause the system to performing according to the description herein.

Figure 2:
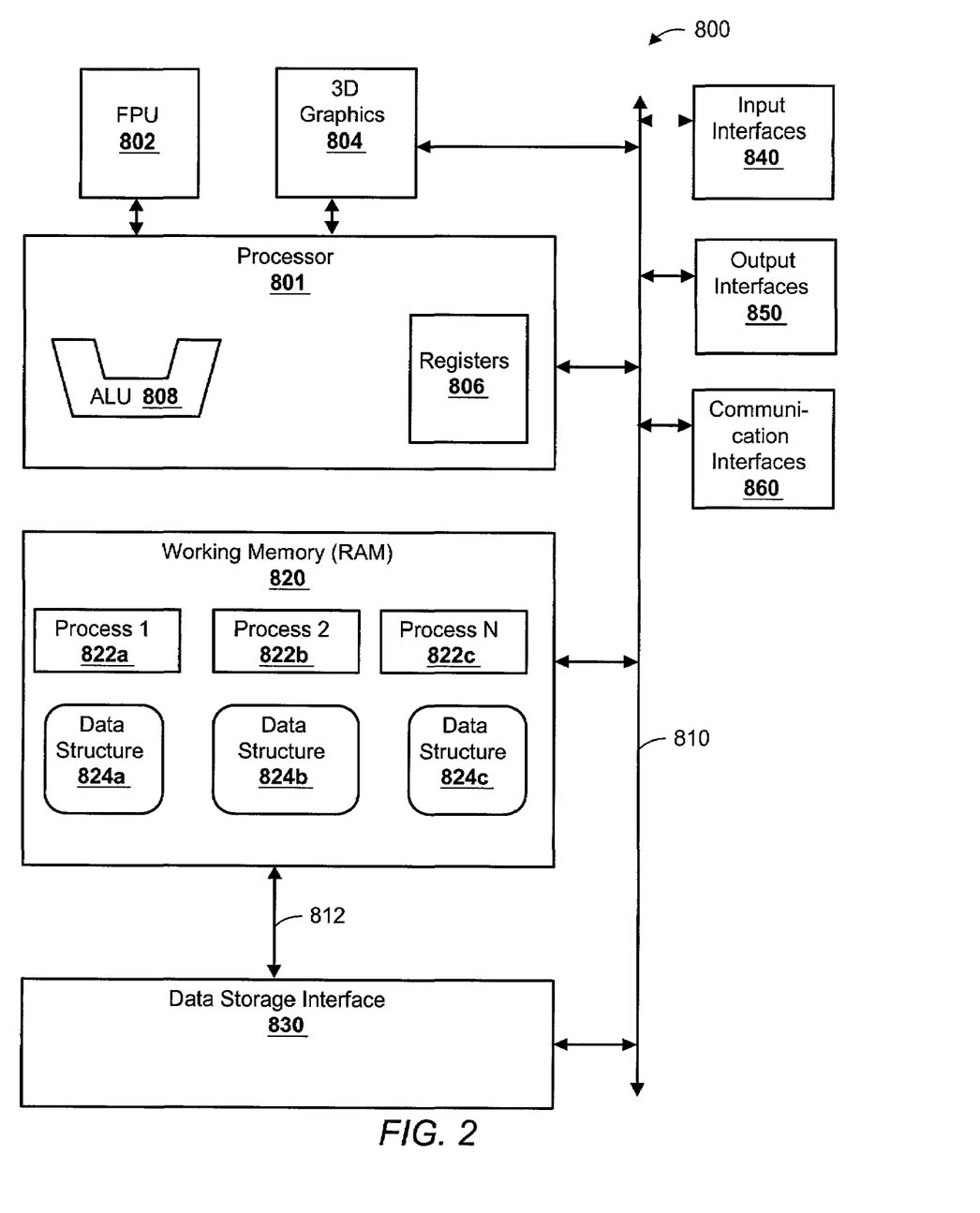
FIG. 2 illustrates an example architecture of an example information handling system relevant to various specific embodiments of the present invention.

FIG. 2 illustrates an example architecture of an example information handling system relevant to various specific embodiments of the present invention. As will be understood to those of skill in the art and from the teachings provided herein, the general organization of a system 800 as shown in FIG. 2 is representative of various information systems ranging from computer-on-a-chip type circuits in a household appliance or toy to super computer systems and distributed systems. In some information handling systems, the various components shown in FIG. 2 may be separable computer chips or separable circuit areas on a computer chip, whereas in other information handling systems, some or all of the functions shown in FIG. 2 will be performed by shared circuitry or implemented in software. Some systems will not have all of the components shown in FIG. 2, and other systems will have additional core components. FIG. 2 does not represent the only device architecture on which the present invention can be performed and it will be understood that the present invention is applicable to a variety of types of information processing devices.

An information handling device typically includes one or more processors, such as 801. Processor 801 is generally characterized as being able to perform different logic operations on data, where logic operations are selected or specified by one or more instructions. In the example of a personal computer system or workstation, processor 801 can represent any of the number of well-known microprocessors manufactured by companies such as Intel, AMD, Zilog, and Motorola. Processor 801 can also represent a subset of circuitry configured as a processor in an integrated circuit such as an ASIC or PLD.

A processor 801 can at times work in cooperation with other information handling circuits (which may or may not also be processors) that may have special-purpose abilities. These circuits may be external from the processor or internal with the processor. As an example, FIG. 2 shows a floating point unit (FPU) 802 and a 3D graphics module 804. A processor 801 may also have a number of structures to facilitate its operation, such as, for example, a set of internal registers 806 and/or an arithmetic logic unit (ALU) 808. In some processors, these structures are internal to the processor circuitry.

In most information handling systems, various modules communicate with other modules over one or more communication paths or buses. FIG. 2 shows a representative system bus 810 and a separate auxiliary bus 812. The illustrated buses can represent signal channels on an integrated circuit, communication connections on a printed circuit board, connection between two or more printed circuit board or a back-plane, or any other channels used by the modules to exchange data or control signals.

In various information processing systems, separable modules can include such things as working memory 820, one or more storage systems 830, one or more input interfaces 840, one or more output interfaces 850. Some information systems also include a communication interface (such as a network interface or a modem) 860 for communicating with other computer systems, such as over a network. These modules are shown in FIG. 2 as broadly representative of aspects of a computing system.

In typical information processing systems, working memory 820 is some type of random access memory (RAM) that can be quickly accessed by processor 801 and possibly by other processors. In general purpose computers and other computer systems, during operation, such a working memory contains the data and instructions for one or more processes 822, including operating system processes. Each process generally represents an executing program or program thread. Working memory 820 can also include one or more data structures 824, which may be associated with particular processes or may be shared or system-wide. These data structures can include data tables or any other data structures that can be represented in digital memory. Therefore, in many general purpose information processing systems (such as personal computers) working memory 820 will be understood in the art as containing resident parts of an operating system and/or of various application systems and/or data files and/or other logic modules or digital data.

As is familiar to those skilled in the art, an information processing system that is a general purpose type computer system further generally includes an operating system and at least one application program. The operating system is a set of logic instructions that control the computer system's operation and the allocation of resources. The application program is a set of logic instructions (possibly also including data) to perform tasks desired by the user. During operation, both may be resident in a memory system such as 820.

Storage 830 is illustrated to represent other, usually more long-term (also called non-volatile) data storage. In general purpose computers, this typically includes one or more disk-type systems (such as hard-disk drives, floppy drives, CD-ROMs, etc.) and can also include a variety of other storage devices. Storage 830 can be used to supplement working memory 820 through a variety of known paging techniques. Storage 830 can also include remote storage systems available over a network. In hand-held devices especially, storage 830 may consist sole of read-only-memory (ROM) used to store executable components of the system. Depending on particular implementations, 830 can represent either storage systems that are part of computer system 800 or an interface to external storage systems.

Input interfaces 840 can represent circuits, devices, and/or logic or instructions that can provide for video, audio, keyboard, pointer, other input to a computer system. Typical input devices include such things as a keyboard or keypad, touch-screen, mouse, microphone, camera, environmental sensors (e.g. a thermostat or a motion detection), etc. Input interfaces 840, along with possibly other modules in the computer system, handle tasks involved in translating external data (such as key strokes) to the appropriate encoded data (typically binary data). These translation tasks can involve multiple steps, performed in various parts of a computer system. Depending on particular implementations, 840 can represent input devices and associated interface logic or only interface logic to particular input devices.

Output interfaces 850 represents circuits, devices, and/or instructions that can provide for video, audio, print or other output from a computer system and can also represent actual output devices. Typical output devices include a display screen, a printer, a speaker, etc. Output can also be in the form of control signals to an external machine such as an engine, manufacturing robot or other computer-controlled device. Output interfaces 850, along with possibly other modules in the computer system, handle tasks involved in translating computer encoded data (typically binary data) to the appropriate form for output. These translation tasks can involve multiple steps, performed in various parts of a computer system. A display of numerical data, for example, typically requires a conversion from binary encoded numerical values to a series of character codes. These character codes are then further translated by display driver circuits to produce the electrical signals needed to excite various pixels on a CRT or LCD type display.

Communication interfaces 860 represents circuits, devices, and/or instructions that allow a computer system to communicate with other information handling systems, such as over a telephone dial-up connection or over the worldwide internet.

In accordance with the practices of persons skilled in the art of computer programming, the invention according to specific embodiments is described herein with reference to symbolic representations of operations that are performed by an information processing system. Such operations are sometimes referred to as being computer-executed or processor-executed. It will be appreciated that the operations that are symbolically represented include the manipulation by a CPU or other logic circuitry of electrical signals representing data bits and the maintenance of data bits at memory locations in a memory system, as well as other processing of signals. The memory locations where data bits are maintained are physical locations that have particular electrical, magnetic, optical, or organic properties corresponding to the data bits.

Thus, it will be understood from the teachings herein that the present invention can, according to specific embodiments, be embodied into an information handling system and/or into different separable components of an information handling system.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

Embodiment in a Programmed Information Appliance

Figure 3:
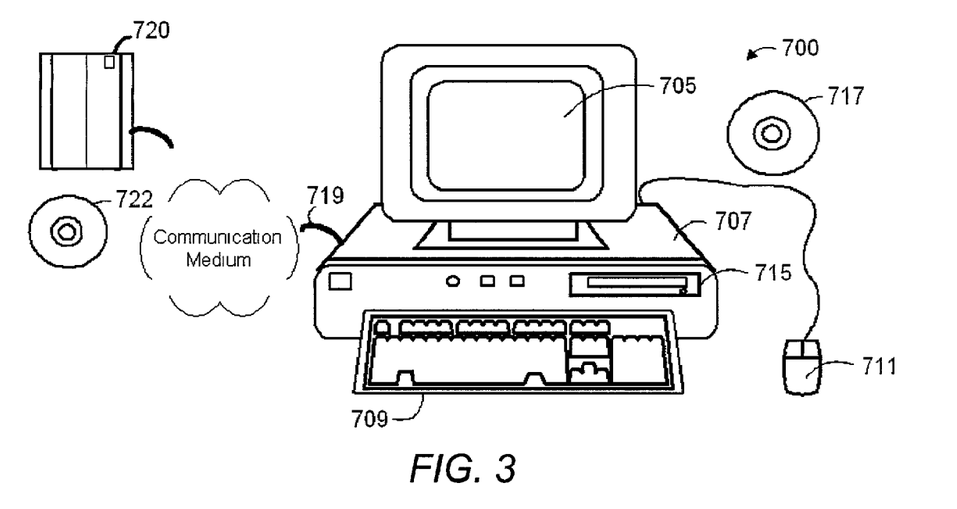
FIG. 3 is a block diagram showing a representative example logic device in which various aspects of the present invention may be embodied.

FIG. 3 is a block diagram showing a representative example logic device in which various aspects of the present invention may be embodied. As will be understood to practitioners in the art from the teachings provided herein, the invention can be implemented in hardware and/or software. In some embodiments of the invention, different aspects of the invention can be implemented in either client-side logic or server-side logic. As will be understood in the art, the invention or components thereof may be embodied in a fixed media program component containing logic instructions and/or data that when loaded into an appropriately configured computing device cause that device to perform according to the invention. As will be understood in the art, a fixed media containing logic instructions may be delivered to a viewer on a fixed media for physically loading into a viewer's computer or a fixed media containing logic instructions may reside on a remote server that a viewer accesses through a communication medium in order to download a program component.

FIG. 3 shows an information appliance (or digital device) 700 that may be understood as a logical apparatus that can read instructions from media 717 and/or network port 719, which can optionally be connected to server 720 having fixed media 722. Apparatus 700 can thereafter use those instructions to direct server or client logic, as understood in the art, to embody aspects of the invention. One type of logical apparatus that may embody the invention is a computer system as illustrated in 700, containing CPU 707, optional input devices 709 and 711, disk drives 715 and optional monitor 705. Fixed media 717, or fixed media 722 over port 719, may be used to program such a system and may represent a disk-type optical or magnetic media, magnetic tape, solid state dynamic or static memory, etc. In specific embodiments, the invention may be embodied in whole or in part as software recorded on this fixed media. Communication port 719 may also be used to initially receive instructions that are used to program such a system and may represent any type of communication connection.

The invention also may be embodied in whole or in part within the circuitry of an application specific integrated circuit (ASIC) or a programmable logic device (PLD). In such a case, the invention may be embodied in a computer understandable descriptor language, which may be used to create an ASIC, or PLD that operates as herein described.

Other Embodiments

The invention has now been described with reference to specific embodiments. Other embodiments will be apparent to those of skill in the art. In particular, a viewer digital information appliance has generally been illustrated as a personal computer. However, the digital computing device is meant to be any information appliance and could include such devices as a digitally enabled television, cell phone, personal digital assistant, etc.

It is understood that the examples and embodiments described herein are for illustrative purposes and that various modifications or changes in light thereof will be suggested by the teachings herein to persons skilled in the art and are to be included within the spirit and purview of this application and scope of the claims.

All publications, patents, and patent applications cited herein are incorporated by reference in their entirety for all purposes.

What is claimed is:

1. A method of representing a numerical value in an information processing apparatus comprising:
   a. storing an integer portion of said numerical value in a first storage area;
   b. storing a fractional portion of said numerical value in a second storage area;
   c. wherein said first storage area and said second storage area are non-contiguous;
   d. wherein an integer portion of said numerical value can be fully determined by reference to said first storage area; and
   e. wherein a fractional portion of said numerical value can be fully determined by reference to said second storage area.

2. The method according to claim 1 wherein said integer portion is stored in said first storage area according to a standard binary integer format.

3. The method according to claim 2 wherein said integer portion is stored in said first storage area as a signed 2's complement binary integer.

4. The method according to claim 1 wherein said fractional portion is stored in said second storage area according to a standard binary integer format.

5. The method according to claim 4 wherein said fractional portion is multiplied by a scale value and then stored in said second storage area according to a standard binary integer format.

6. The method according to claim 5 wherein said scale value is an integer power of 10.

7. The method according to claim 4 wherein said fractional portion is stored in said second storage area as a signed 2's complement binary integer.

8. The method according to claim 1 wherein:
   said integer portion is stored with a separate integer portion sign bit; and
   said fractional portion is stored with a separate fractional portion sign bit.

9. The method according to claim 1 further comprising:
   determining character codes for said numerical value by separately determining character codes for said integer portion and said fractional portion; and
   concatenating separately determined character codes to provide character codes for said numerical value.

10. An apparatus in a computing system for handling real numbers comprising logic modules to perform the method as recited in claim 1.

11. A fixed media containing logical instructions that when loaded into an appropriately configured digital apparatus causes the apparatus to operate in accordance with the method of claim 1.

12. A method allowing an information handling system to handle a range of real numbers comprising:
    creating an IP.FP data template in a memory of said information handling system;
      wherein said data template provides non-contiguous storage areas for:
      an integer part, and
      a fractional part of real number values;
    using a plurality of IP.FP logic routines for performing numerical and logic operations on numerical values stored in IP.FP format.

13. A method of speeding up operation of a computer system performing math operations on numerical values comprising:
    a. storing an integer portion of a numerical value in a first storage area;
    b. storing a fractional portion of said numerical value in a second storage area;
    c. wherein said first storage area and said second storage area are non-contiguous;
    d. using a plurality of custom functions to perform logic and arithmetic operations on said numerical value, said custom functions explicitly handling carry and bit shifting operations involving said numerical value.

14. A device for handling numerical values in an information processing system comprising:
    a. first means for storing integer portions of said numerical values;
    b. second means for storing fractional portions of said numerical values;
    c. said first means and said second means being non-contiguous;
    d. wherein an integer portion of a numerical value can be fully determined from said first means; and
    e. wherein a fractional portion of a numerical value can be fully determined from said second means.

15. The device of claim 14 further wherein:
    an integer portion is stored in said first means using a standard binary integer format; and
    said integer portion is stored in said first means as a signed 2's complement binary integer.

16. The device of claim 14 further wherein:
    a fractional portion is multiplied by a scale value and then stored in said second means using a standard binary integer format.

17. The device of claim 14 further wherein:
said integer portion is stored with a separate integer portion sign bit; and
said fractional portion is stored with a separate fractional portion sign bit.

18. The device of claim 14 further comprising:
means for determining character codes for a numerical value stored as an integer portion and an fractional portion that separately determine character codes for said integer portion and said fractional portion.

19. A system of improving performance in handling numerical value in an information processing apparatus comprising:
a first logic routine for analyzing numerical values in said information processing system, said first logic routine:
storing an integer portion of said numerical value in a first storage area;
storing a fractional portion of said numerical value in a second storage area; and
returning a pointer to said first and said second storage area;
a numerical processor module comprising:
a logic interface for receiving pointers to one or more numerical values stored as integer portions and fractional protions;
a logic interface for receiving an indication of a requested operation to be performed on said one or more numerical values;
processing logic for performing said requested operation and for explicitly handling any necessary carry or bit-shifting operations of said numerical values.

20. The system of claim 19 wherein said system is implemented as run-time computer logic instructions executing in an application and/or operating system process space of an information processing system.

21. The system of claim 19 wherein said system is implemented comprising one or more custom logic hardware components of an information processing system.

* * * * *